US005492478A

United States Patent [19]
White

[11] Patent Number: 5,492,478
[45] Date of Patent: Feb. 20, 1996

[54] ELECTRICAL CONNECTION SYSTEM WITH ALTERNATIVELY POSITIONABLE CONNECTOR

[75] Inventor: Rowland S. White, Pepperell, Mass.

[73] Assignee: MOD-TAP W Corp., Harvard, Mass.

[21] Appl. No.: 167,963

[22] Filed: May 12, 1994

[30] Foreign Application Priority Data

Jul. 5, 1991 [GB] United Kingdom .................. 9115020

[51] Int. Cl.$^6$ ...................................... H01R 9/24
[52] U.S. Cl. ...................... 439/76.1; 439/151; 439/532; 439/637; 439/951
[58] Field of Search ................... 439/59, 60, 76, 439/218, 507, 636, 637, 532, 709, 712, 719, 922, 924, 676, 151, 951

[56] References Cited

U.S. PATENT DOCUMENTS

| | | | |
|---|---|---|---|
| 3,951,494 | 4/1976 | Romine | 439/81 |
| 4,017,696 | 4/1977 | Falk | 439/924.1 |
| 4,095,866 | 6/1978 | Merrill | 439/60 |
| 4,660,920 | 4/1987 | Shibano | 439/631 |
| 4,789,354 | 12/1988 | Smith et al. | 439/395 |
| 4,850,899 | 7/1989 | Maynard | 439/628 |

FOREIGN PATENT DOCUMENTS

| | | |
|---|---|---|
| 0081795 | 12/1982 | European Pat. Off. . |
| 3922431A1 | 7/1989 | Germany . |
| 1155540 | 11/1967 | United Kingdom . |
| 2060279 | 4/1981 | United Kingdom . |
| WO88/09573 | 12/1988 | WIPO . |

Primary Examiner—Neil Abrams
Attorney, Agent, or Firm—Hamilton, Brook, Smith & Reynolds

[57] ABSTRACT

An electrical connection system, for example a dropside patch panel, comprises a mounting rail (12) which receives first connectors (14) arranged with their contacts facing away from the rail (12). Cable introduced between the rail and the connectors is separated into individual conductors which are terminated at contacts (34, 36) via slots (30) in the rail walls. A second connector (16) carries standard data or voice sockets communications (19) which are connected to the first connector via edge contact carrying PCBs (38) which engage in slots (40) in the first connectors. The PCB edge connectors have a discontinuity on one surface, and one half of the contact is connected to the contact on the other side of the PCB to provide a jumpered interconnection between upper (34) and lower (36) rows of contacts of the first connectors in a first position of the second connectors, and contact between the upper rows of contacts and the standard sockets (19) when the second connectors are moved further into the slots (40) to occupy a second position. The slots (40) are formed to receive the PCBs (38) from either end.

15 Claims, 4 Drawing Sheets

FIG. 2

ELECTRICAL CONNECTION SYSTEM WITH ALTERNATIVELY POSITIONABLE CONNECTOR

ELECTRICAL CONNECTION SYSTEM

This invention relates to wiring systems particularly for data and voice communications systems. More specifically the invention is concerned with wiring distribution systems.

In large scale wiring systems it is conventional to use a system of patch panels to connect an array of sub-stations to a main station. For example, a main frame computer in a building is required to communicate with a number of terminals located around the building. As the position of terminals is not usually fixed it is desirable to provide every room in the building and every potential user position within each room with a computer connection point. This will usually result in considerably more connection points than there are user ports on the computer. It is therefore necessary to provide a mechanical interface which allows ports to be connected to the user locations where terminals are to be installed.

The mechanical interface used is a patch frame which is made of two arrays of patch panels, a system patch for the computer parts and a drop patch corresponding to the user positions. Computer ports are linked to selected ones of the user positions by flexible connections known as patch cords which extend between the respective locations on the system and drop patches of the port and user position being linked.

Patch frame mechanical interfaces are used in a similar manner for telephone systems as well as data applications and although this specification describes the invention in terms of data systems it should be construed as being equally applicable to voice communication systems.

Conventionally the system and drop patch arrays have used the same construction of patch panel in which, for example, groups of six eight wire connectors are connected in the panel to a single twenty five pair connector. The twenty five pair connector is then connected via a special cable assembly directly into the computer system to form the system patch.

More recently, the groups of six eight wire connectors and the twenty five pair connector have been available as a single modular component. Such a component is sold by the present applicant under the trade mark Harmonica (RTM).

Although the above structure is satisfactory for the system patch it is not so convenient for the drop patch. To be able to use the same type of panel for the drop patch a secondary connection interface is required. This is because the twenty five pair connector of each group of patch connectors receives a number of cables arranged in a different configuration, typically four pair cables. The secondary connection interface converts the four-pair cable format to twenty-five pair format. Conventionally this secondary interface is an insulation displacement connector system such as the AT & T 110 system or the Krone LSA Plus system.

To reduce the work involved in installing the drop patch it has become usual to integrate the insulation displacement connector into the drop side patch panels which allows the building wiring to be terminated directly on to the rear face of the patch panels. Although various panels incorporating this feature are available commercially they all have the disadvantage that connection of wiring or maintenance requires access to the rear of the panel. As the panel is part of a patch frame this means that, in practice, access to the rear of the patch frame is required. As patch frames may be wall mounted and may be located in areas where there is restricted room for manoeuvre this disadvantage can cause acute problems.

A further disadvantage of existing systems is that it is always necessary to use a patch cord to connect ports to user locations, even when the likelihood of the terminal being moved is remote.

Some existing systems have attempted to eliminate the need for patch cords for terminals which are unlikely to be moved. This has been achieved by use of secondary mechanical switching devices or the use of special data jack connectors with switching contacts. Both have the disadvantage of being complex, awkward and expensive.

The present invention in its various aspects aims to overcome the above mentioned disadvantages and to provide a patching system which is more convenient to install, maintain and use.

The present invention is defined by the claims to which reference should now be made.

According to further aspect of the invention the contact carrying board has edge contacts on both sides. The contacts on one side are divided into at least first and second contact carrying portions separated by an electrical discontinuity. The first portions are connected to the respective contacts on the opposite side of the board.

In a connector system using insulation displacement contacts having two rows of contacts separated by a slot, the contact board may be used to remove the need for patch cord under normal conditions.

The first row of contacts of each insulation displacement connector is wired to, for example, ports of a computer. The second row of contacts is wired to the usual terminal location for the port wired to the respective first row. The position in which the first row of contacts in the insulation displacement contacts contact the first contact portions on the edge connector. These portions are themselves in contact with the contacts on the opposite face of the board which contact the second row of contacts. Thus, in the first position the port is connected directly to the user location wired to the second row of contacts without the need for a patch cord.

In a second position the second portion of the contacts engages the first row of contacts. As these portions are electrically isolated from the contacts on the other side the connection between port and usual terminal is broken and the data connectors connected to the two sets of edge connectors are accessed as before. Patch cords can then be used to connect ports to terminal locations as desired.

Preferably the first connectors each only connect to a single port and a single terminal location, thus each board is movable individually so that a single port only or any desired number of ports can be reconfigured.

One aspect of the invention resides in a system for connecting a source to at least one outlet in which the source is connected to a first connector which is mounted on a mounting means in such a way that connections between the source and the connector can be made from the side of the connector opposite to the side facing the moving means.

In a preferred embodiment the mounting means comprises a channel, and the first connector is mounted in the channel with a space defined between the channel base and the connector. The cable is run along the channel base and individual conductors fed through slots in the channel wall. The conductors are then terminated at contacts on the face of the connector opposite to the channel base.

This arrangement has the advantage that the cabling can be wired without requiring access to the rear side of the system.

Preferably the first connectors are insulation displacement connectors having a slot for receiving a second connector.

In a preferred embodiment the slot is an edge connector board to which data or other connectors are wired in a desired configuration. The edge contacts can be slotted into the insulation displacement connector and a patch cord connected to the data connector.

Preferably the slot in the insulation displacement connector extends through the connector which has the advantage that the contact carrying board can be inserted from either side of the connector. The invention also resides in a connector including a through slot.

Embodiments of the invention will now be described, by way of example, and with reference to the accompanying drawings, in which.

Figure 1:
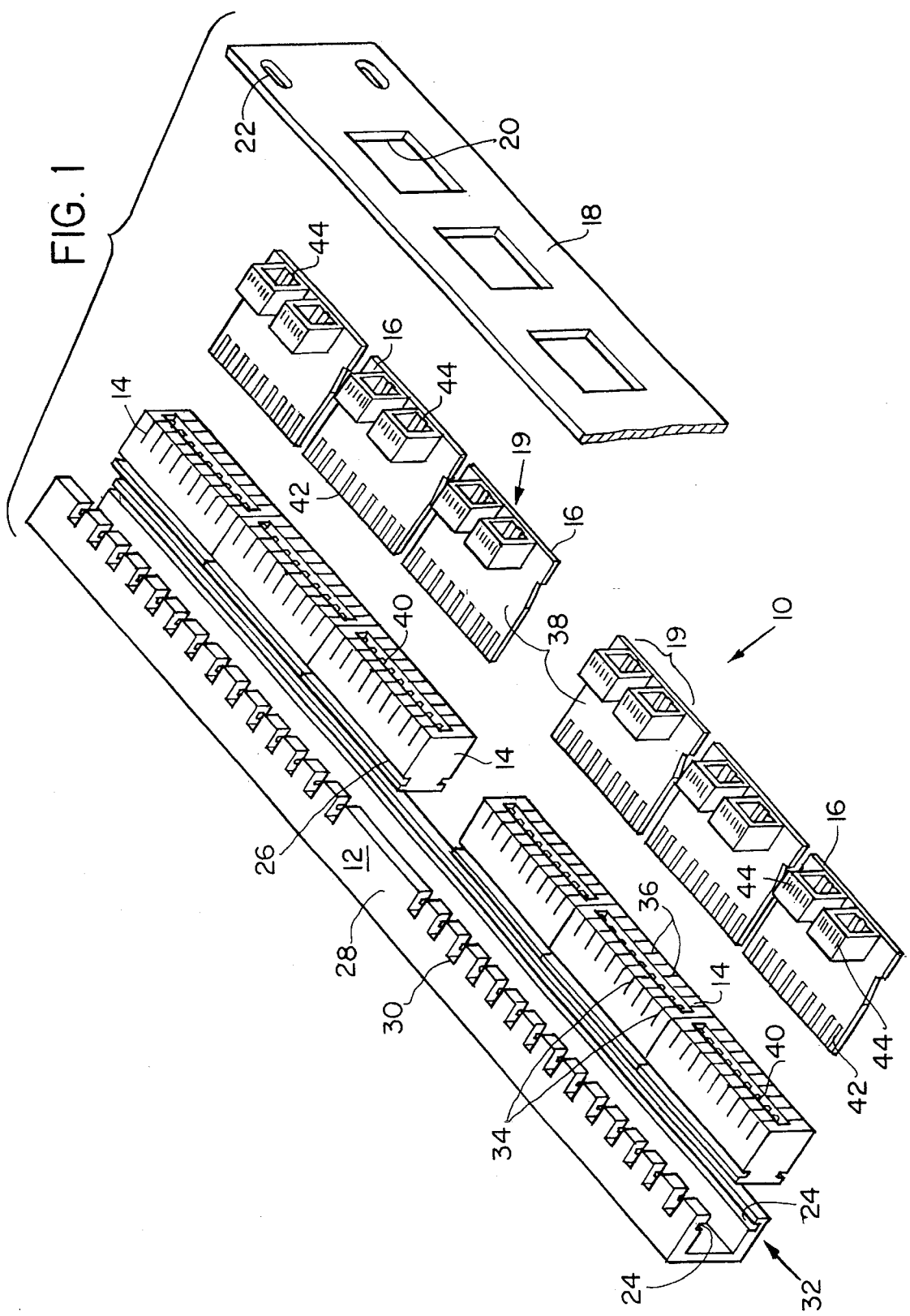
FIG. 1 is an exploded view of a drop side patch panel embodying a first aspect of the invention.

FIG. 1 shows the components of a single patch panel on the drop side patch. In practice an array of these patch panels is used to make up the drop side patch. Conventionally the panels are stacked one above the other in the array. However, the panel illustrated has the advantage that it can be stacked end-to-end as will be explained.

The panel 10 comprises a mounting rail 12, an array of building interface connectors 14, an array of PCD mounted jacks 16 and a cover plate 18 (only partially shown). When assembled, pairs of patch connector jacks 19 are accessible through respective apertures 20 in the cover plate. The cover plate has at its corners mounting holes 22 which receive screws for connection to the drop side patch frame (not shown).

The mounting rail 12 comprises a C-shaped channel having on the inside of each of its side walls a groove 24 which receives a corresponding rib 26 on the building interface connectors the building interface connectors may be clipped into position. The walls 28 carry a number of slots 30 which form wire outlet guides to facilitate the correct mounting of wires, (in the figure slots are only shown on one wall for ease of reference. Cables for connection to the building interface connectors may be inserted from the open end of the channel as shown by arrow 32.

The building interface connectors 14 include insulation displacement contacts 62 which each have upper and lower rows of insulation displacement contact blades 34, 36 which respectively connect with upper and lower faces of printed circuit boards (PCB's) 38. The rows of contacts 34, 36 are accessed by a slot 40 which extends right through the connector enabling the circuit board to be inserted from each side of the connector.

To wire in the insulation displacement contacts cabling is introduced into the channel 12 as described. Individual wires are fed out from the cable through the relevant slot 30, over the outside of the connector 14, and into the displacement contact where they are terminated.

It will be appreciated that the slots 30 are arranged in groups of 14 along the channel with a gap between groups. This corresponds to the prior art arrangement of six eight wire connectors such as those used in Harmonicas (RTM) and presents an easily interpreted arrangement to the user.

The individual insulation displacement connectors and contacts (IDCs) within those connectors are preferably those described in our co-pending International patent application number PCT/GB92/00998 claiming priority from British application 9112604.5 of Jun. 12, 1991.

As can be seen from FIG. 1, the connectors 14 are mounted on the rail 12 with the contacts at the front of the assembly. Thus, with the mounting rail arranged in a frame the IDCs can be wired from the front of the assembly, overcoming one of the disadvantages of the prior art. Maintenance is also easy as the IDCs are readily accessed by unscrewlug the cover plate 18 and removing the printed circuit boards 38.

The presentation of the fixed building wiring at the building interface connector is transformed to the Industry Standard for the service to be provided by the connection of a modular interface unit, here shown as PCB mounted jacks 16. Typically the jacks are a pair of eight wire modular data connectors, although other numbers or standards of connector may be provided. In the embodiment shown, one of the connectors 44 is wired to the upper terminals 42 of the edge connection printed circuit board and the connections of the other connector are wired, according to the relevant standard, to the lower terminals. Thus, when the PCB is in position with the edge connectors received in the slot 40 of one of the insulation displacement connectors one of the connectors 44 will be connected to the upper row of contacts and the other to the lower row of contacts.

The individual user positions are wired to respective ones of the upper and lower rows of contacts so that when a given PCB with associated connectors is inserted each connector is brought into contact with a user position in the building. A patch cord is then inserted into the connector and the other end of the cord is inserted into a desired connector on the system patch to connect the user position to a terminal.

Various modifications to the embodiment described could be adopted. For example, it is not essential that the building interface connector is an insulation displacement type connector, other wire connection technologies could be used. It will be understood that the system could be used with optic fibre systems in which case optic fibre connection technology would replace the insulation displacement connectors.

Similarly, it is not essential that the interface between the sockets of the building interface connector and the connectors 44 are PCB edge type connectors. Other types of interface could be used and in particular other types of socket-plug interface. It would be possible for the building interface connector to comprise the plug and the interface with the connectors 44 to the patch cords to comprise the socket.

Similarly, although described as building interface connectors, the system need not be used solely in buildings. The patching system could easily be installed, for example, in ships or land vehicles.

Although described with respect to drop patching, the configuration of the insulation displacement connectors or other interface connector with respect to its mounting has advantages which could be realised in different environments, for example in wall mounted sockets in telephone systems where a number of wires must be connected at individual user outlets.

Figure 2:
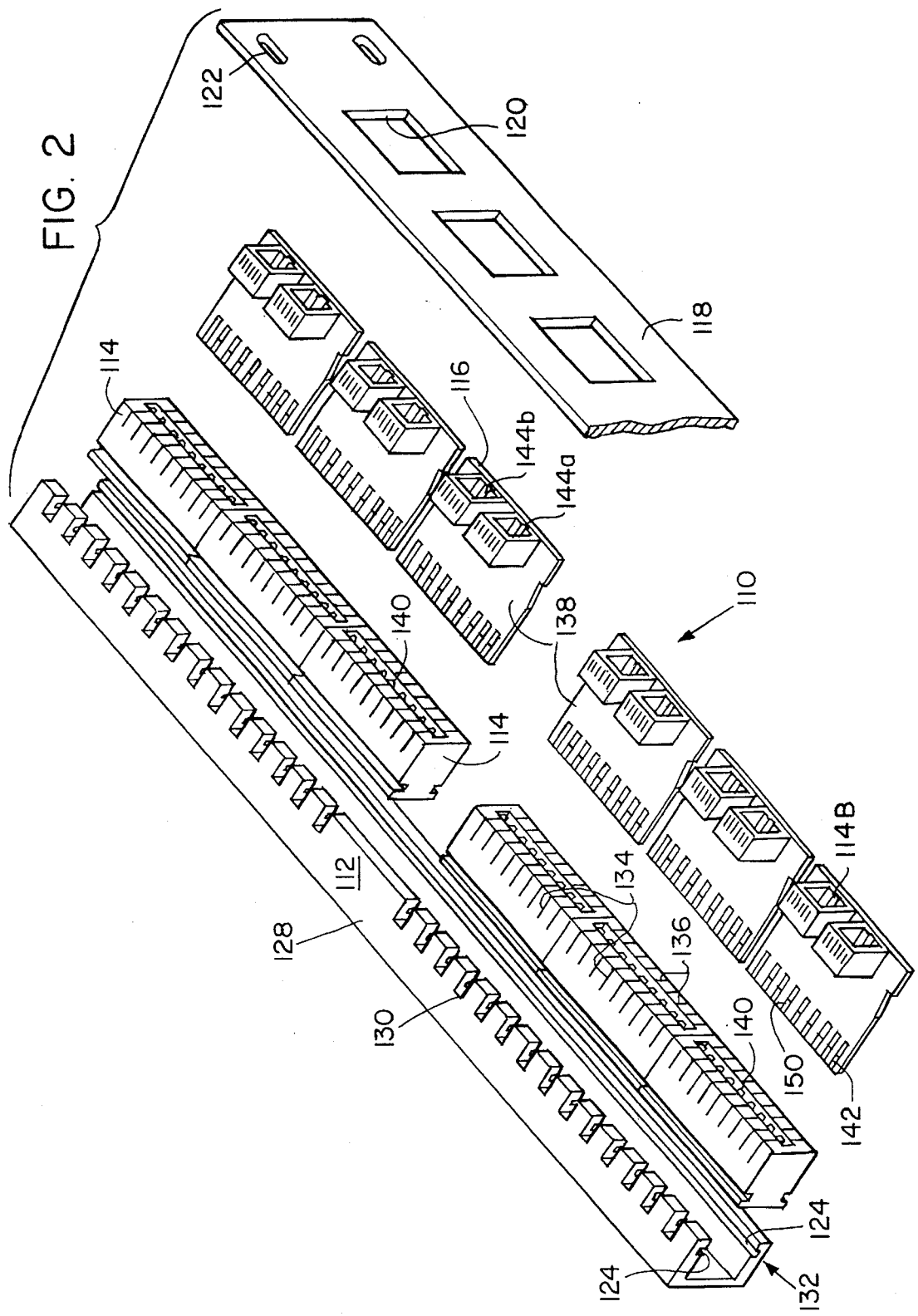
FIG. 2 is a modified form of the embodiment of FIG. 1 embodying a second aspect of the invention.
Figure 3:
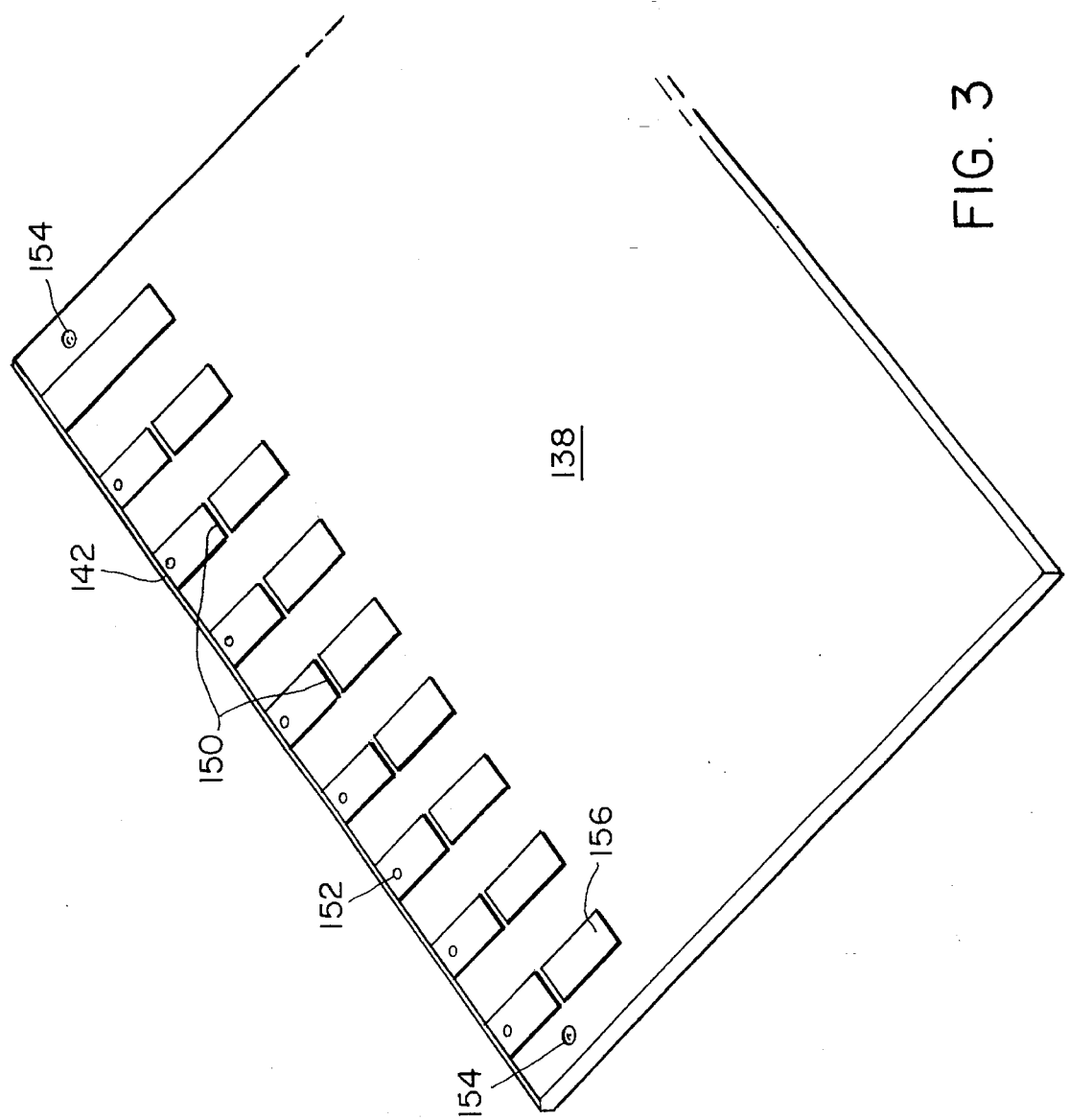
FIG. 3 is a partial view of an edge connector for use in the system of FIG. 2 and embodying the second aspect of the invention.
Figure 4:
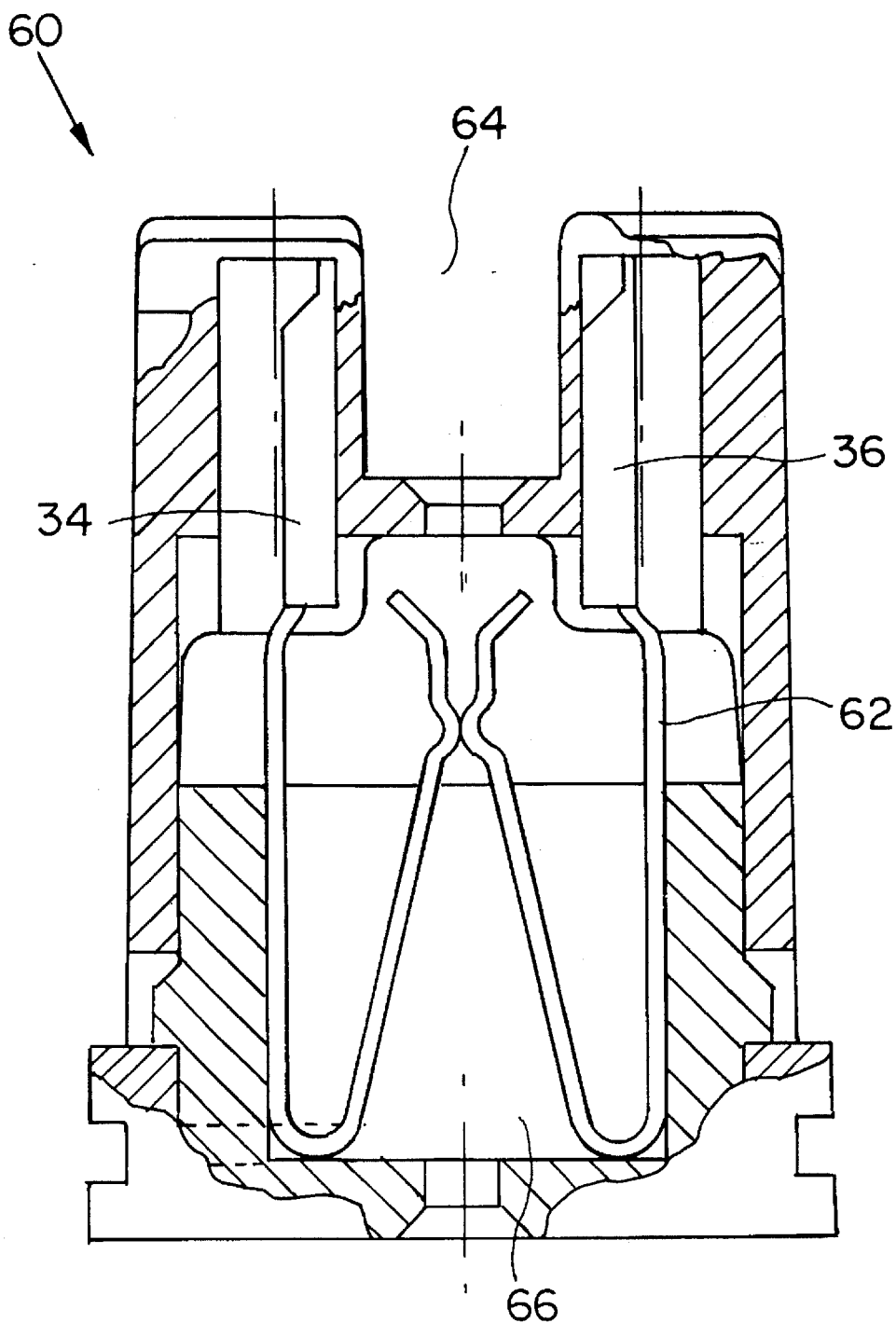
FIG. 4 is a sectional view of the interface connectors 14 as shown in FIG. 1 which includes the upper and lower portions of the insulation displacement contacts.

Turning now to FIGS. 2 and 3 a second aspect of the invention is illustrated. The construction of the patch panel is the same as that of FIG. 1 and the same reference numerals are used with the addition of 100. The wiring connections to the various components are different as will be described.

Although, as described, it is desirable to be able to connect different user locations to different ports, there will be in most systems, a number of terminals or telephones which are unlikely to be moved. The embodiments of FIGS. 2 and 3 removes the need for patch cords for these terminals whilst retaining the possibility of future movement should the need arise.

The printed circuit board used for insertion into the building interface connector shown in FIG. 3 has been modified to produce a discontinuity 150 on one side of the edge contacts. A similar discontinuity may be introduced onto the other side. The effect of the discontinuity is such that on insertion into the slot 140 of a respective building interface contact only the front portion of the circuit board makes electrical contact with the interface connector 114. The front portion is connected by plated holes 152 to a corresponding track on the other face of the circuit board so that when in this first partially inserted position the upper and lower contacts of the building interface connector are connected together.

The wiring of the drop patch panel of FIG. 2 is modified from that of FIG. 1 by wiring the computer port connections to the top (or bottom) row of insulation displacement contacts 134 and wiring the bottom (or top) row of contacts 136 to the user positions which correspond to the normal position of the terminals or telephones. Thus, with the PCB 138 in its first partially inserted position the computer or telephone port connections will be connected directly to the terminals in their usual positional configuration.

Further insertion of the PCB to a fully inserted second position in which the discontinuity 150 extends beyond the IDCs breaks the contact between the upper and lower contact pairs pairs of the IDCs. Thus, the port and the user location associated with that port under normal use appear at adjacent standard patch field connectors 144a,b. For example, the connector 144a wired to the rear end 156 of the contact strips on the upper side of the PCB will be connected to a computer port whereas connector 144b wired to the lower connectors will be connected to a user position. Patch cords can then be used between port and position patch field connectors 144 to establish connections as required.

To ensure firm location of the PCBs into the first and second position the PCBs are provided with a pair of apertures 154 which engage pips on the faces of slots 140 of the insulation displacement contacts. The apertures 154 could merely be detents and could, be located on the insulation displacement connectors with the pips on the PCB.

The various embodiments of the invention described have a number of advantages over the prior art discussed previously. In addition to overcoming the need for rear access and eliminating the need for patch cords under normal operating surfaces connector arrays can be built up which corresponds to available cable sizes and wiring practices. Previously it has only been possible to obtain arrays in limited fixed pair counts. In addition end-to-end mounting of patch panels is possible by virtue of the arrangement of the contacts of the insulation displacement connectors in upper and lower rows. Moreover, the density of insulation displacement contacts can be chosen to match the density of patch field connectors 144 so avoiding unnecessary components and cost.

Although it is usually advantageous to have front access to the building interface connectors, the use of a through slot 40, 140 means that the circuit board could be introduced from either side so that if required, the interface connectors could be reversed to allow rear-face access to the insulation displacement contacts.

The use of a mounting rail which has an integral channel for building cables and wire outlet guides minimizes the vertical spacing required between adjacent panels as no ties or restraints are needed for the cables. However, guide rings, spacers and other accessories for cable tidiness can easily be clipped into the grooves on the inside walls of the rails.

As well as reducing vertical spacing, the overall installation space is greatly reduced as the arrangement incorporates the secondary connection interrase into the patch panel. In addition the combined high-density of the connector system and the cable management within the mounting rails can allow up to twice as many connections per unit height as conventional systems. The system also lends itself to expansion: more, or more complex switching may be achieved by different arrangements of the circuit board interconnections or by introducing further discontinuities into the edge connectors whereby further insertion positions could be adopted.

The invention has been described in terms of an electrical system it is to be understood that the invention is equally applicable to concept to optical systems.

I claim:

1. A communications system comprising a first connector which comprises a housing, first and second rows of contacts arranged in the housing, such that a slot is formed between the first and second rows of contacts, and a further connector having edge contacts for insertion into the slot to establish conductive connection between the edge contacts and the first and second rows of contacts, the further connector comprising at least one communications connector mounted on a board and conductively coupled to the edge contacts on the board, the edge contacts having conductive portions on opposite faces of the boards, wherein each of the edge contacts include a conductive discontinuity dividing each of the contacts on one face of the board into first and second portions, the first portions being coupled to the communications connector and conductively isolated from the respective second portions and the second portions being conductively coupled to corresponding contacts on the opposite face of the board, wherein the edge contacts of the further connector are insertable in a first position in which respective first portions of the edge contacts are each conductively coupled to respective single contact of one of the first and second rows of contacts, and a second position in which the second portions of said contacts are each conductively coupled to respective single contact of one of the first and second rows of contacts, thereby to conductively connect the first row of contacts to the second row of contacts.

2. A communications system according to claim 1, wherein a respective conductive discontinuity divides the edge contacts on both faces of the board.

3. A communications system according to claim 1, wherein the second portions of edge contacts on one face of the board are conductively coupled to corresponding contacts on the opposite face of the board by apertures (152) coated with conductive material extending through the board.

4. A communications system according to claim 1, wherein the board includes one or more additional edge contacts not including the said conductive discontinuity.

5. A communications system according to claim 1, comprising engagement means (154) for engaging the edge contacts with the first connector.

6. A communications system according to claim 5, wherein the engagement means comprises a hole, recess or bead.

7. A communications system according to claim 1, wherein the slot in the housing of the first connector extends through the housing to enable insertion of the contact carrying board from the front contact carrying face of the connector or from the rear connector face.

8. A communications system according to claim 1 comprising a mounting means for housing the first connector, the first connector is an insulating displacement type connector arranged on the mounting means such that the first and second rows of contact of the insulation displacement type connector are accessible for coupling with said further connector.

9. A communications system according to claim 1 wherein the first connector is an insulation displacement connector and one of the first and second rows of contacts is coupled to a cable, such as a source cable from a computer, and the other of the first and second rows of the contacts is coupled to one or more outlets corresponding to computer terminal locations, whereby insertion of the edge contacts to the second position connects the cable to the outlets.

10. A system according to claim 1, comprising a plurality of first connectors comprising insulation displacement type connectors and a plurality of said further connections.

11. A communications system according to claim 8, wherein the mounting means comprises a channel member including means for retaining the insulation displacement type connector at a height above the base wall of the channel member.

12. A communications system according to claim 11, wherein the first connector comprises a plurality of contacts and a second connector comprises a plurality of contacts, each contact engaging a respective contact of the first connectors.

13. A communications system according to claim 11, wherein the retaining means comprises a groove in the side wall of one of the channels and the insulation displacement type connector and a corresponding rib in the side wall of the other of said channel and insulation displacement type connector.

14. An insulator displacement connector comprising a housing having front and rear receiving ends, first and second rows of insulation displacement contacts arranged in the housing, and a slot in the housing to receive a printed circuit board having a plurality of edge contacts which, upon insertion into the slot, makes electrical connections with the first and second rows of insulation displacement contacts, the slot being extended through the housing to allow insertion of the board from the front receiving end as well as the rear receiving end of the connector.

15. An insulator displacement connector comprising a housing having front and rear receiving ends, first and second rows of insulation displacement contacts arranged in the housing, and a continuous slot in the housing to receive a contact carrying member having a plurality of contacts which, upon insertion into the slot, makes electrical connections with the first and second rows of insulation displacement contacts, the slot being extended through the housing to allow insertion of the contact carrying member from the front receiving end as well as the rear receiving end of the connector.

* * * * *